United States Patent
Schmelzer

(10) Patent No.: US 10,384,545 B2
(45) Date of Patent: Aug. 20, 2019

(54) DEVICE AND METHOD FOR MONITORING AN ELECTRICAL INSULATION IN A VEHICLE ELECTRICAL SYSTEM

(71) Applicant: CONTINENTAL AUTOMOTIVE GMBH, Hannover (DE)

(72) Inventor: Lars Schmelzer, Regensburg (DE)

(73) Assignee: CPT Group GmbH, Hannover (DE)

( * ) Notice: Subject to any disclaimer, the term of this patent is extended or adjusted under 35 U.S.C. 154(b) by 216 days.

(21) Appl. No.: 15/128,311

(22) PCT Filed: Mar. 25, 2015

(86) PCT No.: PCT/EP2015/056445
§ 371 (c)(1),
(2) Date: Sep. 22, 2016

(87) PCT Pub. No.: WO2015/144779
PCT Pub. Date: Oct. 1, 2015

(65) Prior Publication Data
US 2017/0106754 A1 Apr. 20, 2017

(30) Foreign Application Priority Data
Mar. 28, 2014 (DE) .......................... 10 2014 205 877

(51) Int. Cl.
*G01N 27/00* (2006.01)
*B60L 3/00* (2019.01)
(Continued)

(52) U.S. Cl.
CPC ............... *B60L 3/0069* (2013.01); *B60L 3/04* (2013.01); *B60L 50/40* (2019.02); *B60L 50/51* (2019.02);
(Continued)

(58) Field of Classification Search
CPC .......................... G01R 31/005; G01R 31/1227; G01R 31/025; G01R 31/006; G01R 31/14;
(Continued)

(56) References Cited

U.S. PATENT DOCUMENTS 6,700,384 B2 * 3/2004 Yugou .............. G01R 19/16542
324/425
2011/0006777 A1 * 1/2011 Park ...................... B60L 3/0046
324/509
(Continued)

FOREIGN PATENT DOCUMENTS

| CN | 101162244 A | 4/2008 |
| CN | 102426326 A | 4/2012 |

(Continued)

OTHER PUBLICATIONS

PCT/EP2015/056445 International Search Report and the Written Opinion of the International Searching Authority dated Jul. 17, 2015.
(Continued)

*Primary Examiner* — Minh N Tang

(57) ABSTRACT

A device for monitoring an electrical insulation in the case of a vehicle electrical system of a vehicle, includes: a voltage source for generating direct voltages having a first and a second voltage value; a voltage-measuring unit between a positive and a negative power supply line of the vehicle electrical system for measuring a voltage between the positive and the negative power supply line; a current path between a positive current connection of the voltage source and the positive power supply line; a current-measuring unit in the current path for measuring a current flowing through the current path; a determining unit designed to determine an insulation resistance between the vehicle electrical system and an electrical ground from voltage measurement values of the voltage-measuring unit, (Continued)

current measurement values of the current-measuring unit, and the first and the second voltage value.

10 Claims, 2 Drawing Sheets

(51) Int. Cl.
   *G01R 31/00* (2006.01)
   *G01R 31/02* (2006.01)
   *G01R 31/14* (2006.01)
   *B60L 3/04* (2006.01)
   *B60L 50/40* (2019.01)
   *B60L 50/51* (2019.01)

(52) U.S. Cl.
   CPC ......... *G01R 31/006* (2013.01); *G01R 31/025* (2013.01); *G01R 31/14* (2013.01); *Y02T 10/7005* (2013.01); *Y02T 10/7022* (2013.01)

(58) Field of Classification Search
   CPC ...... G01R 27/025; G01R 27/08; G01R 27/18; B60L 3/0069; B60L 3/0046; B60L 3/0061; G06K 19/0701; G06K 19/0723
   See application file for complete search history.

(56) References Cited

U.S. PATENT DOCUMENTS

| | | | |
|---|---|---|---|
| 2013/0300430 A1* | 11/2013 | Lindsay | B60L 3/0046 |
| | | | 324/522 |
| 2017/0108544 A1* | 4/2017 | Schmelzer | G01R 27/025 |

FOREIGN PATENT DOCUMENTS

| | | |
|---|---|---|
| CN | 103383417 A | 11/2013 |
| CN | 103605056 A | 2/2014 |
| DE | 4339946 A1 | 6/1995 |
| DE | 102010030079 A1 | 12/2011 |
| DE | 102011050590 A1 | 11/2012 |
| EP | 2256506 A1 | 12/2010 |
| WO | 2013147494 A1 | 10/2013 |

OTHER PUBLICATIONS

Chinese Office Action dated May 11, 2018 for corresponding Chinese application No. 201580015039.3.
Chinese Second Office Action dated Dec. 28, 2018 for corresponding Chinese application No. 201580015039.3.
German Office Action dated Mar. 4, 2019 for corresponding German application No. 10 2014 205 877.5.

* cited by examiner

DEVICE AND METHOD FOR MONITORING AN ELECTRICAL INSULATION IN A VEHICLE ELECTRICAL SYSTEM

TECHNICAL FIELD

The invention relates to a device and a method for monitoring an electrical insulation in an on-board system, specifically of a vehicle, in particular a hybrid/electric vehicle. The invention also relates to an on-board system for a vehicle and a vehicle, specifically a hybrid/electric vehicle with an on-board system, wherein the on-board system includes an above-mentioned device.

BACKGROUND

Modern vehicles, specifically hybrid or electric vehicles, have on-board systems incorporating a high voltage (HV) system branch with a service voltage of several hundred volts.

However, for a person, specifically a child, a voltage exceeding 60 Volts (V) is life threatening. An HV system branch with a service voltage exceeding 60 V is therefore electrically insulated from the rest of the on-board system or from the vehicle bodywork, in order to eliminate the hazard to persons.

In case of technical defects in the on-board system or operating errors, a "fault current" can flow from the HV system branch through the human body. If the electrical insulation between the above-mentioned HV system branch and the rest of the on-board system or the vehicle bodywork is intact and sufficiently high, the fault current strength is limited to a non-hazardous value for persons.

However, if the electrical insulation is not sufficiently high, a fault current with a rating of several milliamps can flow through the human body, which can be life threatening to persons.

As such, in order to avoid such life-threatening fault currents from the outset, electrical insulation in the on-board system must be constantly monitored and potential hazards identified at the earliest opportunity.

SUMMARY

Therefore, it is desirable to provide a cost-effective option for monitoring electrical insulation in an on-board system of a vehicle.

The cost-effective option is described by the subjects of the following disclosure According to an aspect of the disclosure, a device is provided for monitoring electrical insulation in an on-board system of a vehicle, specifically a hybrid/electric vehicle.

Accordingly, the device includes a voltage source, which is designed to generate or deliver a first direct current (DC) voltage with a first voltage value and a second DC voltage with a second voltage value.

The device also includes a voltage-measuring unit, which is arranged or electrically connected between a positive power supply line and a negative power supply line in the on-board system. The voltage-measuring unit is designed to measure a voltage between the positive and the negative power supply line.

The device may have a current path between a positive power connection of the voltage source and the positive power supply line in the on-board system. Alternatively, the device may have a current path between the positive power connection of the voltage source and the negative power supply line in the on-board system.

The device may also include a current-measuring unit in the current path that is designed, by the action of the first and the second DC voltages of the voltage source, to measure a current flowing in the current path.

In some examples, the device includes an evaluation unit, which is electrically connected via a first signal input to a signal output from the voltage-measuring unit and via a second signal input to a signal output from the current-measuring unit. The evaluation unit is designed to determine, from a first measured voltage value on the voltage-measuring unit measured in response to the first DC voltage, from a second measured voltage value on the voltage-measuring unit measured in response to the second DC voltage, from a first measured current value on the current-measuring unit measured in response to the first DC voltage, from a second measured current value on the current-measuring unit measured in response to the second DC voltage, and from the first voltage value of the first DC voltage and the second voltage value of the second DC voltage, an insulation resistance between the on-board system and electrical ground or between the HV system branch and the rest of the on-board system.

The term "DC voltage" is understood as a voltage which shows a constant voltage value for a specific time interval which is used for the measurement of the above-mentioned measured current values. The voltage source thus generates DC voltages with different, but constant voltage values.

For monitoring the electrical insulation in the on-board system, specifically between the HV system branch and the rest of the on-board system or the vehicle bodywork, the device uses the voltage source to generate two indirectly or directly sequential DC voltages with different voltage values within a specific time interval. In response to the two DC voltages, currents with different current values flow in the current path and from the current path to the positive or negative power supply line on the on-board system, depending upon which of the two power supply lines the current path electrically connects the voltage source with.

In some examples, if the electrical insulation in the on-board system, specifically between the HV system branch and the rest of the on-board system or the vehicle bodywork and thus electrical ground is sufficiently high, no or virtually no current flows, in response to the two DC voltages, from the HV system branch or from the power supply lines to the rest of the on-board system or to electrical ground.

If, for example, as a result of defects in the on-board system, the on-board system or the HV system branch is not adequately insulated from the vehicle bodywork or from the rest of the on-board system, a leakage current path is formed between the HV system branch and the rest of the on-board system, or between the power supply lines and the vehicle bodywork, through which, in response to the two DC voltages, leakage currents can flow from the HV system branch to the rest of the on-board system or to the vehicle bodywork.

In some implementations, the device uses the current-measuring unit to measure currents flowing in the current path, and the voltage-measuring unit to measure voltages between the two power supply lines of the HV system branch. In addition, with reference to the measured current and voltage values and the known voltage values of the two DC voltages generated, the device may determine the insulation resistance between the HV system branch and the rest of the on-board system or the vehicle bodywork.

The determined insulation resistance thus may then be compared with a predefined reference resistance. If the determined insulation resistance undershoots the reference resistance, an electrical leakage between the on-board system and electrical ground, or between the HV system branch and the rest of the on-board system or electrical ground, may be assumed. Accordingly, warnings are issued to the vehicle driver, or suitable predefined measures, specifically suitable automatic measures, are deployed. Possible automatic measures include, for example, electrical isolation from the on-board system or the discharging of electric energy stores, including e.g. traction batteries or super-capacitors, with charging voltages greater than 60V.

As a voltage source, for example, a simple DC voltage converter may be used, which is electrically connected to a LV system branch and which, by stepping-up (and, where applicable, by inverting) the service voltage of the LV system branch generates the two DC voltages. The evaluation unit may include a simple and cost-effective microprocessor and a cost-effective analog-digital converter.

In some implementations, the device is thus provided which, using simple and cost-effective electrical/electronic components, permits for the reliable determination of electrical insulation in an on-board system of a vehicle, specifically between a HV system branch and the rest of the on-board system or the vehicle bodywork, in a simple manner.

Accordingly, a cost-effective option is provided for the reliable monitoring of an electrical insulation in an on-board system of a vehicle.

In some examples, the device, in the current path, incorporates a resistor for the limitation of currents flowing in the current path in response to the two DC voltages. The resistor is thus configured with a high ohmic rating. In some examples, the resistor has a resistance value of the order of one megaohm.

Yet another aspect of the disclosure provides the device that in the current path, incorporates a controllable switch for the interruption or formation of an electrical connection in the current path. By the controlled opening of the switch, in the time during which no monitoring of the electrical insulation is in progress, the device may be electrically isolated from the on-board system, and thus protected from potential damage by overvoltages. In some examples, when used, i.e. for the monitoring of the electrical insulation, the device may be electrically connected to the on-board system, by the controlled closing of the switch.

Yet another aspect of the disclosure provides the device that including an evaluation unit designed to determine the insulation resistance as a quotient of the difference between the first and the second voltage value, corrected respectively by the voltage values observed respectively on the resistor in the current path in response to the respective DC voltages, and the voltage values of the respective voltages associated with the respective DC voltages between the positive and the negative power supply line, and the difference between the first and the second current value of the currents flowing in the current path in response to the respective DC voltages.

Another aspect of the disclosure provides a device having an evaluation unit designed for the determination of the insulation resistance using the following equation, by an iterative calculation method:

$$R_{ISO_m} = \frac{(Uq1 - I1 \cdot R) - (Uq2 - I2 \cdot R) - k_m \cdot (Ub1 - Ub2)}{(I1 - I2)}$$

where:

Uq1 is the first voltage value of the first DC voltage;
Uq2 is the second voltage value of the second DC voltage;
I1 is the first measured current value of the current which flows in the current path in response to the first DC voltage;
I2 is the second measured current value of the current which flows in the current path in response to the second DC voltage;
Ub1 is the first measured voltage value, measured under the first DC voltage, of the voltage present between the positive and the negative power supply line;
Ub2 is the second measured voltage value, measured under the second DC voltage, of the voltage present between
the positive and the negative power supply line;
R is the electrical resistance in the current path or an electrical resistance between the positive power terminal of the voltage source and the positive or
negative power supply line of the on-board system; and
$K_m$ is a corrective value.

In some implementations, the evaluation unit is designed for the determination of the corrective value km using the following equation, by an iterative calculation method:

$$k_m = \frac{Uq - I \cdot R_{ISO_{m-1}} - I \cdot R}{Ub}$$

where Uq, I and Ub respectively are the first voltage value, the first measured current value and the first measured voltage value, or respectively the second voltage value, the second measured current value and the second measured voltage value. $R_{ISOm-1}$ is an insulation resistance value, which is determined in the $(m-1)^{th}$ iteration by the application of the previous equation.

The iteration is repeated until the insulation resistance value R_ISOm no longer varies, varies by a negligibly small amount, or varies by a recurring decimal fraction. Thereafter, the most recently determined insulation resistance value R_ISOm, as the current insulation resistance, is compared with the predefined reference resistance.

In some implementations, the first voltage value of the first DC voltage is between 50 and 60V. In some examples, the second voltage value of second DC voltage is between −60 and −50V.

The upper limiting values of 60 or −60V thus constitute the upper limit for generatable DC voltages which are still not life-threatening to persons or vehicle passengers.

The lower limiting values of 50 or −50V permit a voltage range of at least 100V between the two DC voltages which, in measured current values for the first, second and third currents, is associated with correspondingly high differences in value. The high differences in measured current values in turn permit the accurate determination of insulation resistance. Moreover, high voltage values permit a robust response to voltage fluctuations in the current paths or in the on-board system.

A further aspect of the disclosure provides an on-board system for a vehicle, specifically for a hybrid/electric vehicle, wherein the on-board system incorporates an above-described device for monitoring electrical insulation in the on-board system or between an HV system branch of the on-board system and the rest of the on-board system or the vehicle bodywork.

Yet another aspect of the disclosure provides a vehicle, specifically a hybrid/electric vehicle with an on-board system, wherein the on-board system incorporates an above-described device for the monitoring of electrical insulation in the on-board system or between an HV system branch of the onboard system and the rest of the on-board system or the vehicle bodywork.

Another aspect of the disclosure provides a method for the monitoring electrical insulation in an on-board system, specifically in a vehicle, specially a hybrid/electric vehicle. The method includes: switching a voltage source between an electrical ground and a power terminal on a positive power supply line of the on-board system or a negative power supply line of the on-board system; and generating a first DC voltage with a first voltage value, using the voltage source. The method also includes measuring a first measured voltage value of a voltage between the positive and negative power supply line and a first measured current value of a current flowing between the voltage source and the power terminal, as the first DC voltage is generated. The method also includes generating a second DC voltage with a second voltage value, using the voltage source; and measuring a second measured voltage value of the voltage and a second measured current value of the current, as the second DC voltage is generated.

The method also includes determining an insulation resistance between the on-board system and electrical ground from the first and the second voltage values, the first and the second measured current values and the first and the second measured voltage values.

In some examples, a voltage source is switched or electrically connected between electrical ground and a power terminal of a positive power supply line of the on-board system. In other examples, the voltage source is switched or electrically connected between electrical ground and a power terminal of a negative power supply line of the on-board system.

For the monitoring of the electrical insulation in the on-board system, a first DC voltage with a first voltage value is generated for a specific time interval, using the DC voltage source.

During this time, the current flowing in the current path in response to the first DC voltage and a voltage present between the positive and the negative power supply line in response to the first DC voltage are measured. The first measured current value thus obtained and the first measured voltage value are logged for the determination of an insulation resistance between the on-board system or between a HV system branch of the on-board system and the rest of the on-board system or electrical ground.

In a given time interval, indirectly or directly after the measurement of the first measured current value and the first measured voltage value, a second DC voltage with a second voltage value is generated for a specific time interval, using the DC voltage source.

In some implementations, during this time interval, a current flowing in the current path in response to the second DC voltage and a voltage present between the positive and the negative power supply line in response to the second DC voltage are measured. The resulting second measured current value and the second measured voltage value are also used in the determination of the insulation resistance.

From the first and the second measured current values, the first and the second measured voltage values, and the first and the second voltage values of the two DC voltages generated, the insulation resistance is then determined.

In some examples, the determined insulation resistance value is compared with a predefined reference resistance value. If the determined insulation resistance value undershoots the reference resistance value, an electrical leakage between the on-board system and electrical ground, or between the HV system branch and the rest of the on-board system or electrical ground, is assumed.

In some implementations, the above-mentioned steps of generating the first DC voltage, measuring the first measure voltage, generating the second DC voltage, and determining the insulation resistance are executed with the vehicle in service. Thus, electrical insulation in the on-board system may also be determined during the time in which the service voltage is present in the on-board system and on-board system currents are flowing.

Advantageous implementations and examples of the device described above, insofar as transferable to the above-mentioned on-board system or vehicle, or to the above-mentioned method, are also to be considered as advantageous aspects of the on-board system, vehicle, or method.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1:
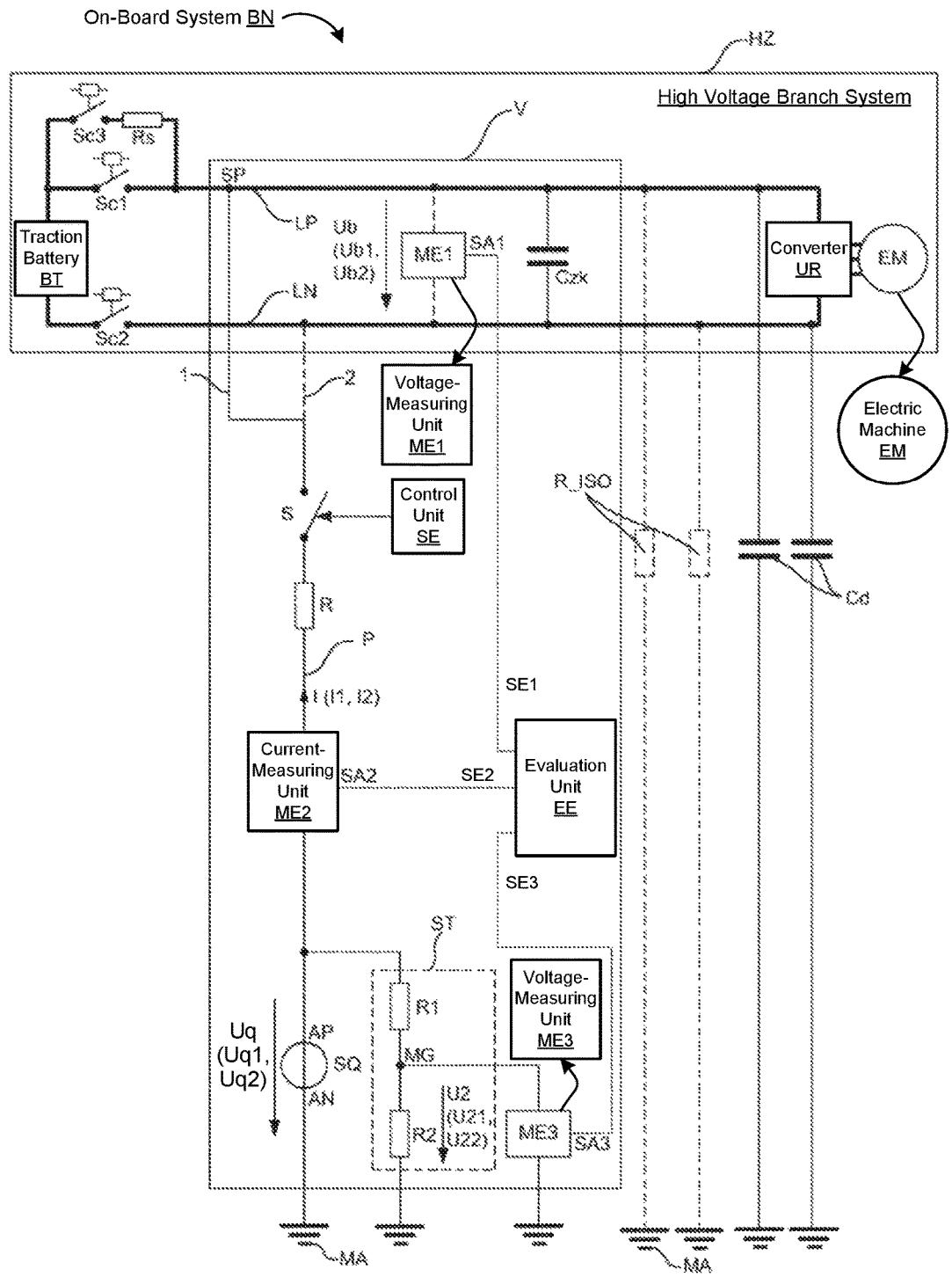
FIG. 1 is a schematic view of an exemplary on-board system in an electric vehicle with a device.

Referring to FIG. 1, an on-board system BN of an electric vehicle, not represented in the figure, includes a device V for monitoring electrical insulation in the on-board system BN. The on-board system BN includes an HV system branch HZ. The HZ system branch carries a service voltage of approximately 500V. The HV system branch HZ delivers electric current for an electric machine EM in the HV system branch HZ, which is used for the propulsion of the electric vehicle.

In this HV system branch HZ, the on-board system BN is provided with a power and current source in the form of a traction battery BT, which delivers the requisite current for the operation of the electric machine EM or the propulsion of the electric vehicle.

In some examples, by a controllable contactor Sc1, Sc2 in each case, the traction battery BT is electrically connected respectively to a positive and a negative power supply line LP, LN of the HV system branch HZ. Additionally to the first contactor Sc1, the traction battery BT may be electrically connected via a third controllable contactor Sc3 and a protective resistor Rs to the positive power supply line LP. The third contactor Sc3 and the protective resistor Rs may be electrically interconnected in series and electrically connected in parallel to the first contactor Sc1 between the traction battery BT and the positive power supply line LP.

In the HV system branch HZ, the on-board system BN may also include a converter UR. The converter UR converts the current delivered by the traction battery BT into phase currents and delivers the phase currents to the electric machine EM.

The positive power supply line LP and the negative power supply line LN here connect the traction battery BT to the converter UR, through which current flows from the traction battery BT to the converter UR.

In some implementations, between the positive power supply line LP and the negative power supply LN, the HV system branch HZ includes an intermediate circuit capacitor Czk. The intermediate circuit capacitor Czk offsets voltage fluctuations in the service voltage Ub of the HV system branch HZ and maintains the service voltage Ub at the requisite voltage value.

In some examples, between the positive power supply line LP and electrical ground MA, and between the negative power supply line LN and electrical ground MA respectively, the HV system branch HZ includes a discharge capacitor Cd.

The on-board system BN may include an LV system branch, not represented in the figure, in which, according to the electric vehicle design, a service voltage, e.g., of 12V, is present. In this LV system branch, electrical consumers are electrically connected and operate at the service voltage of 12V. These electrical consumers include, for example, but are not limited to, vehicle lights, navigation systems, electric window heaters or electric air-conditioning compressors.

In some examples, at 500V, the service voltage Ub on the HV system branch HZ is life-threatening to vehicle passengers. In order to prevent the uncontrolled discharge of current in the HV system branch HZ, at the high service voltage Ub, via the LV system branch or via the electrical ground MA to the on-board system BN or the vehicle bodywork, thus endangering the health of vehicle passengers, the HV system branch HZ or the two power supply lines LP, LN are galvanically separated and electrically insulated from the rest of the on-board system BN, and thus from the LV system branch or the electrical ground MA.

Electrical insulation between the HV system branch HZ and the rest of the on-board system BN, and thus the electrical ground MA, is schematically represented in the figure by the notional insulation resistance R_ISO.

In some implementations, to prevent any flow of current from the HV system branch HZ to the LV system branch or to the electrical ground MA, and thus the potential electrocution of persons, the insulation resistance R_ISO may be sufficiently high.

In the event of defects or faults in the on-board system, galvanic isolation between the HV system branch HZ and the rest of the on-board system BN or the electrical ground MA may be compromised, potentially resulting in damage to the electric vehicle and injury to vehicle passengers.

For the improvement of safety in the electric vehicle, electrical insulation or an insulation resistance between the HV system branch HZ and the rest of the on-board system BN or electrical ground MA may be continuously monitored. In some examples, if the insulation resistance value undershoots a stipulated reference resistance value, the traction battery BT, by the controlled opening of all three contactors Sc1, Sc2, Sc3, may be electrically isolated from the HV system branch HZ, and the intermediate circuit capacitor Czk may be discharged down to a charging voltage of less than 60V.

In some implementations, the on-board system BN includes a device V for monitoring electrical insulation in the on-board system BN, or between the HV system branch HZ and the rest of the on-board system BN or electrical ground MA.

In some examples, the device V includes a power terminal SP, via which the device V or a circuit member of the device V is electrically connectable to the positive or the negative power supply line LP, LN of the HV system branch HZ. As shown in FIG. 1, the device V or a circuit member of the device V is electrically connected to the positive power supply line LP, as designated in the figure by the number 1. Alternatively, the device V may be electrically connected to the negative power supply line LN, as illustrated in the figure by the number 2.

Between the power terminal SP and electrical ground MA, the device V includes a voltage source SQ configured as a DC voltage converter with a connectable/disconnectable inverter. Via a positive power connection AP, the voltage source SQ may be electrically connected to the power terminal SP of the device V. Via a negative power connection AN, the voltage source SQ may be electrically connected to the electrical ground MA.

Between the power terminal SP and the positive power connection AP of the voltage source SQ, the device V is provided with a current path P, via which the voltage source SQ is electrically connected to the positive power supply line LP.

In some examples, in the current path P, the device V includes a current-measuring unit ME2. The current measuring unit ME2 is electrically connected between the power terminal SP and the positive power connection AP of the voltage source SQ.

The device V may also include a coupling resistor R, which is electrically connected in the current path P between the power terminal SP and the current-measuring unit ME2.

The device V may also include a controllable switch S electrically connected in the current path P between the power terminal SP and the coupling resistor R. In a closed circuit state, the switch S may form an electrical connection between the positive power supply line LP and the current path P, specifically the voltage source SQ. In an open circuit state, the switch S may interrupt the electrical connection between the positive power supply line LP and the current path P, and thus the voltage source SQ.

In some examples, the device V also includes a control unit SE for the closing or opening of the switch S.

The device may include a first voltage-measuring unit ME1, which is connected between the positive and the negative power supply lines LP, LN of the HV system branch HZ. The first voltage-measuring unit ME1 may be designed for the measurement of the voltage Ub on the positive power supply line LP in relation to the negative power supply line LN.

Between the positive power connection AP of the voltage source SQ and the electrical ground MA, the device V may include a voltage divider ST, which is connected in parallel to the voltage source SQ. The voltage divider ST includes two series-connected resistors R1, R2. Between a central tap-off point MG of these two resistors R1, R2 and the electrical ground MA, the device V incorporates a second voltage-measuring unit ME3, which is designed for the measurement of the voltage U2 on the resistor R2.

The device V may also include an evaluation unit EE for the determination of the notional insulation resistance R_ISO. The evaluation unit EE may include a first, second and third signal input SE1, SE2, SE3. Via the first signal input SE1, the second signal input SE2 and the third signal input SE3, the evaluation unit EE is electrically connected to a signal output SA1 on the first voltage-measuring unit ME1, to a signal output SA2 on the current-measuring unit ME2, and to a signal output SA3 on the second voltage-measuring unit ME3 respectively.

Figure 2:
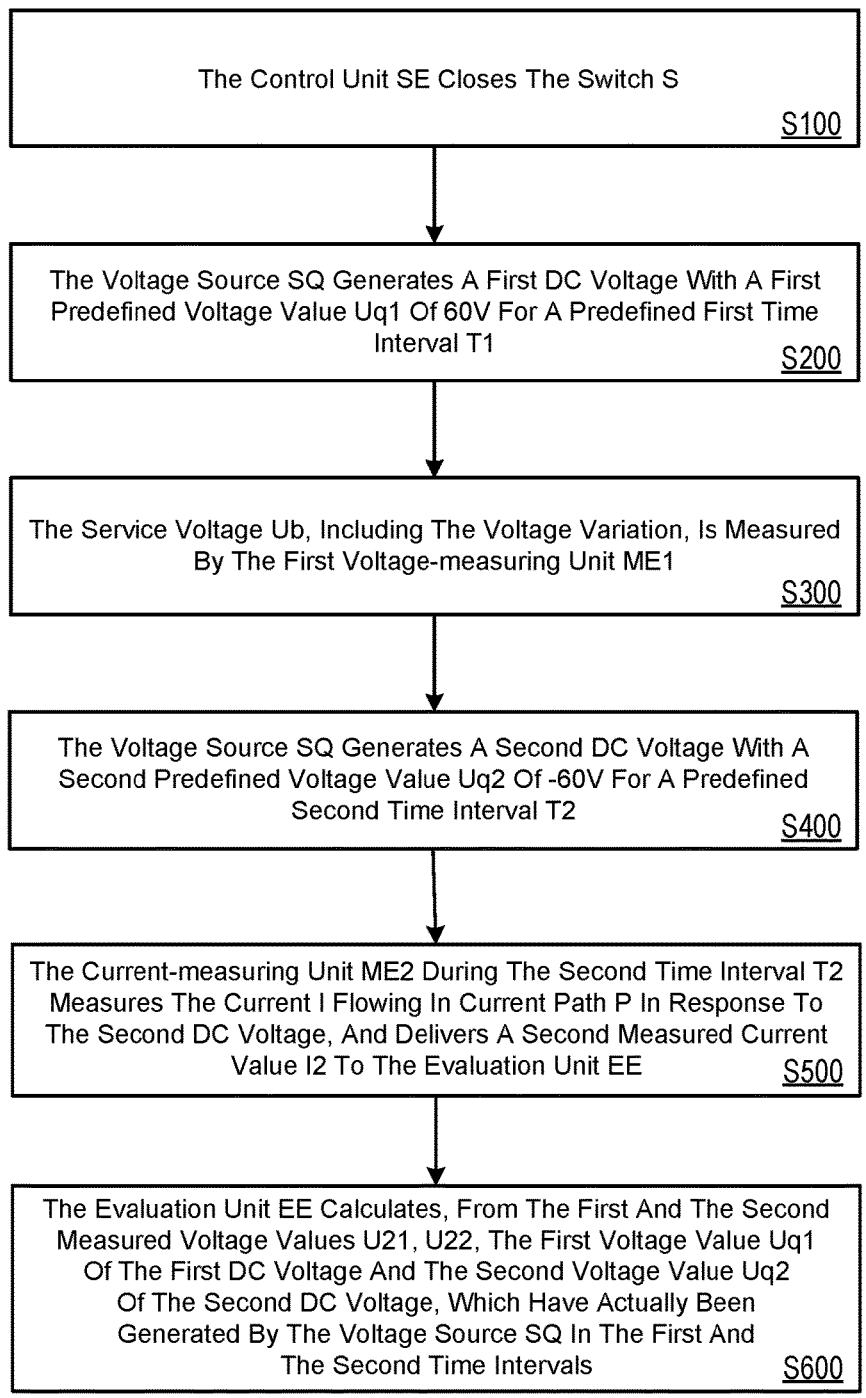
FIG. 2 is a schematic view of an exemplary arrangement of operations for monitoring electrical insulation in an on-board system.

The operating method of the device V, and specifically of the evaluation unit EE, is described in greater detail hereinafter with reference to FIG. 2, in conjunction with the description of the method for monitoring the electrical insulation in the on-board system BN or in the HV system branch HZ.

For monitoring the electrical insulation in the on-board system BN, the notional insulation resistance R_ISO is determined continuously during the operation of the electric vehicle and compared with a predefined reference resistance value.

To this end, the control unit SE, in a process step S100, closes the switch S, thereby connecting the device V and the voltage source SQ to the HV system branch HZ, thus forming an electrical connection between the current path P or the device V and the positive power supply line LP.

In a process step S200, the voltage source SQ generates a first DC voltage with a first predefined voltage value Uq1 of 60V for a predefined first time interval t1. In so doing, the voltage source SQ converts the 12V service voltage from the LV system branch to 60V.

This first DC voltage generates a DC current I in current path P, flowing from the current path P into the positive power supply line LP. In the positive power supply line LP, the DC current I is superimposed on a service current Ib flowing in the positive power supply line LP, resulting in a voltage variation in the service voltage Ub.

The service voltage Ub, including the voltage variation, is measured by the first voltage-measuring unit ME1 in a further process step S300, and is used to determine the insulation resistance R_ISO. In so doing, the first voltage-measuring unit ME1, at a predefined time interval td1 which is temporarily offset from the starting time at which the voltage source SQ starts to generate the first DC voltage, measures the service voltage Ub, and refers a first measured voltage value Ub1 to the evaluation unit EE. This predefined time interval corresponds to the time interval for the damping of the intermediate circuit capacitor Czk and the discharge capacitors Cd in the on-board system BN following the application of the first DC voltage to the positive power supply line LP.

Simultaneously, the current-measuring unit ME2 may measure the DC current I in current path P and deliver a first measured current value I1 via the signal output SA1 to the evaluation unit EE.

In addition, and also simultaneously, the second voltage-measuring unit ME3 may measure the voltage U2 on the resistor R2 of the voltage section ST and, via the signal output SA3, and may deliver a first measured voltage value U21 of the voltage U2 to the evaluation unit EE.

After the expiry of the first time interval t1 and a predefined time interval tv needed for the damping of the intermediate circuit capacitor Czk and the discharge capacitors Cd, the voltage source SQ in a further process step S400 generates a second DC voltage with a second predefined voltage value Uq2 of −60V for a predefined second time interval t2. In so doing, the voltage source SQ converts the 12V service voltage from the LV system branch to 60V, and inverts the latter.

By analogy to process step S300, the current-measuring unit ME2, in a further process step S500 during the second time interval t2, which is temporarily offset by a predefined time interval td2 from the starting time at which the voltage source SQ starts to generate the second DC voltage, measures the current I flowing in current path P in response to the second DC voltage, and delivers a second measured current value I2 to the evaluation unit EE. The predefined time interval td2 may correspond to the interval time needed for the damping of the intermediate circuit capacitor Czk and the discharge capacitors Cd in the on-board system BN following the application of the second DC voltage to the positive power supply line LP. Simultaneously, the two voltage-measuring units ME1, ME3 may measure the respective voltages Ub, U2 and may deliver a respective second measured voltage value Ub2, U22 to the evaluation unit EE.

In a further process step S600, the evaluation unit EE may then calculate, from the first and the second measured voltage values U21, U22, using the following two equations (EQ. 1 and EQ. 2), the first voltage value Uq1 of the first DC voltage and the second voltage value Uq2 of the second DC voltage, which have actually been generated by the voltage source SQ in the first and the second time intervals:

$$Uq1 = \frac{R1 + R2}{R2} \cdot U21 \quad (1)$$

$$Uq2 = \frac{R1 + R2}{R2} \cdot U22 \quad (2)$$

By the measurement of the two measured voltage values U21, U22 and the subsequent calculation of the two voltage values Uq1, Uq2 for the DC voltages actually generated, a potential evaluation error in the insulation resistance associated with a deviation in the DC voltages generated is prevented, and the accuracy of the insulation resistance R_ISO determined is thus enhanced.

Once the evaluation unit EE has calculated the two voltage values Uq1, Uq2, the evaluation unit EE uses these two voltage values Uq1, Uq2 and the two measured current values I1, I2, together with the two measured voltage values Ub1, Ub2 from the first voltage-measuring unit ME2, for the iterative determination of the insulation resistance R_ISO$_m$, using the following equation (EQ. 3):

$$\text{R\_ISO}_m = \frac{(Uq1 - I1 \cdot R) - (Uq2 - I2 \cdot R) - k_m \cdot (Ub1 - Ub2)}{(I1 - I2)} \quad (3)$$

where $k_m$ is a corrective value. This corrective value $k_m$ is determined iteratively by the evaluation unit EE from the most recently determined insulation resistance R using the following equation (EQ. 4):

$$k_m = \frac{Uq - I \cdot R_{ISO_{m-1}} - I \cdot R}{Ub} \quad (4)$$

The evaluation unit EE repeats the iteration until the insulation resistance value R_ISO$_m$ no longer varies, varies by a negligibly small amount, or varies by a recurring decimal fraction. Thereafter, the most recently determined insulation resistance value R_ISO$_m$ as the current insulation resistance, is compared with the reference resistance.

If the insulation resistance R_ISO thus determined exceeds the reference resistance, it is assumed that the electrical insulation in the on-board system BN or between the HV system branch HZ and the rest of the on-board system BN or the electrical ground MA is sufficiently high, and fulfils the corresponding safety requirements.

As soon as the insulation resistance R_ISO thus determined undershoots the reference resistance, an electrical leakage in the on-board system BN or between the HV system branch HZ and the rest of the on-board system BN or the electrical ground MA is assumed. Accordingly, the traction battery BT, by the controlled opening of the three contactors Sc1, Sc2, Sc3, is electrically isolated from the HV system branch HZ and the intermediate circuit capacitor Czk is discharged to a charging voltage below 60V, and further appropriate measures are implemented.

The method described above may also be executed continuously during the operation of the electric vehicle, during which the traction battery BT, via the two power supply lines LP, LN, supplies current to the converter UR or the electric machine EM.

In some examples, during the respective time intervals t1, t2, a plurality of measured current and voltage values for the DC current I and the respective voltages Ub, U2 may be measured in sequence and, from this plurality of measured values, average values can be generated for the respective measured current values I1, I2 and the respective measured voltage values Ub1, Ub2, U21, U22. By this arrangement, potential disturbances such as current fluctuations in the on-board system BN can be filtered out, thereby enhancing the accuracy of the insulation resistance R_ISO thus determined.

Once determination is complete, the control unit SE may open the switch S, thereby separating the device V from the on-board system BN or from the HV system branch HZ.

A number of implementations have been described. Nevertheless, it will be understood that various modifications may be made without departing from the spirit and scope of the disclosure. Accordingly, other implementations are within the scope of the following claims.

What is claimed is:

1. A device for monitoring an electrical insulation in an on-board system, the device comprising:
    a voltage source for generating a first DC voltage with a first voltage value and a second DC voltage with a second voltage value;
    a voltage-measuring unit between a positive power supply line of the on-board system and a negative power supply line of the on-board system for the measurement of a voltage between the positive power supply line and the negative power supply line;
    a current path between a positive power connection of the voltage source and the positive or the negative power supply line;
    a current-measuring unit in the current path for the measurement of a current flowing in the current path; and
    an evaluation unit electrically connected via a first signal input to a signal output from the voltage-measuring unit and via a second signal input to a signal output from the current-measuring unit, the evaluation unit designed to determine, from a first measured voltage value measured in response to the first DC voltage and from a second measured voltage value measured in response to the second DC voltage on the voltage-measuring unit, from a first measured current value measured in response to the first DC voltage and a second measured current value measured in response to the second DC voltage on the current-measuring unit, and from the first voltage value and the second voltage value, an insulation resistance between the on-board system and electrical ground.

2. The device of claim 1, further comprising a resistor in the current path for limiting the current.

3. The device of claim 1, further comprising a controllable switch in the current path for the interruption or formation of an electrical connection in the current path.

4. The device of claim 1, wherein the evaluation unit is designed to determine the insulation resistance as a quotient of the difference between the first voltage value and the second voltage value, corrected respectively by voltage values observed respectively on a resistor in the current path, and the voltage values of the respective voltages between the positive power supply line and the negative power supply line, and the difference between the first measured current value and the second measured current value.

5. The device of claim 1, wherein the evaluation unit is designed for the iterative determination of the insulation resistance using the following equation:

$$R\_ISO_m = \frac{(Uq1 - I1 \cdot R) - (Uq2 - I2 \cdot R) - k_m \cdot (Ub1 - Ub2)}{(I1 - I2)}$$

where $R_{ISO_m}$ is the insulation resistance, Uq1 is the first voltage value of the first DC voltage, Uq2 is the second voltage value of the second DC voltage, I1 is the first measured current value, I2 is the second measured current value, Ub1 is the first measured voltage value, Ub2 is the second measured voltage value, R is an electrical resistance of the resistor, and $k_m$ is a corrective value.

6. The device of claim 5, wherein the evaluation unit is designed for the iterative determination of the corrective value $k_m$ using the following equation:

$$k_m = \frac{Uq - I \cdot R_{ISO_{m-1}} - I \cdot R}{Ub}$$

where Uq, I and Ub respectively are the first voltage value, the first measured current value and the first measured voltage value, or respectively the second voltage value, the second measured current value and the second measured voltage value, and $R_{ISO_{m-1}}$ is an insulation resistance value, which is determined in the $(m-1)^{th}$ iteration, where m≥1.

7. The device of claim 1, wherein the first voltage value is 50 to 60V and the second voltage value is −60 to −50V.

8. An on-board system for a vehicle, wherein the on-board system incorporates a device as claimed in claim 1 for the monitoring of electrical insulation in the on-board system.

9. A method for monitoring electrical insulation in an on-board system of a vehicle, the method comprising:
    switching a voltage source between an electrical ground and a power terminal on a positive power supply line of the on-board system or a negative power supply line of the on-board system;
    generating a first DC voltage with a first voltage value, using the voltage source;
    measuring a first measured voltage value of a voltage between the positive power supply and the negative power supply line and a first measured current value of a current flowing between the voltage source and the power terminal, as the first DC voltage is generated;
    generating a second DC voltage with a second voltage value, using the voltage source;
    measuring a second measured voltage value of the voltage and a second measured current value of the current, as the second DC voltage is generated;

determining an insulation resistance between the on-board system and electrical ground from the first and the second voltage values, the first and the second measured current values and the first and the second measured voltage values.

10. The method of claim 9, wherein generating the first DC voltage, measuring the first measured voltage value, generating the second DC voltage, measuring the second measured voltage, and determining the insulation resistance are executed while the vehicle is in service.

* * * * *